(12) United States Patent
Chen et al.

(10) Patent No.: US 9,340,898 B2
(45) Date of Patent: May 17, 2016

(54) PROCESS FOR GROWING SILICON CARBIDE SINGLE CRYSTAL BY PHYSICAL VAPOR TRANSPORT METHOD AND ANNEALING SILICON CARBIDE SINGLE CRYSTAL IN SITU

(75) Inventors: Xiaolong Chen, Beijing (CN); Bo Wang, Beijing (CN); Longyuan Li, Beijing (CN); Tonghua Peng, Beijing (CN); Chunjun Liu, Beijing (CN); Wenjun Wang, Beijing (CN); Gang Wang, Beijing (CN)

(73) Assignees: Tankeblue Semiconductor Co. Ltd., Beijing (CN); Institute of Physics Chinese Academy of Sciences, Beijing (CN)

( * ) Notice: Subject to any disclaimer, the term of this patent is extended or adjusted under 35 U.S.C. 154(b) by 291 days.

(21) Appl. No.: 13/994,306
(22) PCT Filed: Nov. 11, 2011
(86) PCT No.: PCT/CN2011/082107
§ 371 (c)(1),
(2), (4) Date: Jun. 14, 2013
(87) PCT Pub. No.: WO2012/079439
PCT Pub. Date: Jun. 21, 2012

(65) Prior Publication Data
US 2013/0269598 A1    Oct. 17, 2013

(30) Foreign Application Priority Data
Dec. 14, 2010    (CN) .......................... 2010 1 0588052

(51) Int. Cl.
*C30B 23/06*    (2006.01)
*C30B 23/00*    (2006.01)
(Continued)

(52) U.S. Cl.
CPC ............... *C30B 23/002* (2013.01); *C30B 23/06* (2013.01); *C30B 29/36* (2013.01); *C30B 33/02* (2013.01)

(58) Field of Classification Search
CPC ...... C30B 23/00; C30B 23/002; C30B 23/02; C30B 23/06; C30B 23/063; C30B 33/00; C30B 33/02; Y10T 117/00; Y10T 117/10; Y10T 117/1004; Y10T 117/1008; Y10T 117/1012; Y10T 117/1016
USPC .................. 117/84–86, 88–89, 105, 937, 951
See application file for complete search history.

(56) References Cited

U.S. PATENT DOCUMENTS 5,968,261 A     10/1999   Barrett et al.
6,451,112 B1 *   9/2002   Hara ....................... C30B 23/00
                                                          117/101
(Continued)

FOREIGN PATENT DOCUMENTS

CN          1554808          12/2004
CN         101984153          3/2011
(Continued)

OTHER PUBLICATIONS

Tairov et al., Journal of Crystal Growth 43 (1978), pp. 209-212.

*Primary Examiner* — Kenneth A Bratland, Jr.
(74) *Attorney, Agent, or Firm* — D. Peter Hochberg; Sean F. Mellino

(57) ABSTRACT

A technology for growing silicon carbide single crystals by PVT (Physical Vapor Transport) and a technology for in-situ annealing the crystals after growth is finished is provided. The technology can achieve real-time dynamic control of the temperature distribution of growth chamber by regulating the position of the insulation layer on the upper part of the graphite crucible, thus controlling the temperature distribution of growth chamber in real-time during the growth process according to the needs of the technology, which helps to significantly improve the crystal quality and production yield. After growth is finished, the inert gas pressure in growth chamber is raised and the temperature gradient of the growth chamber is reduced so that in-situ annealing the silicon carbide crystals can be carried out under a small one, which helps to reduce the stress between the crystal and the crucible lid as well as that in sublimation grown crystals to reduce the breakage ratio and improve the yield ratio during the subsequent fabrication process.

15 Claims, 4 Drawing Sheets

(51) Int. Cl.
*C30B 29/36* (2006.01)
*C30B 33/02* (2006.01)

(56) References Cited

U.S. PATENT DOCUMENTS 7,767,022 B1 * 8/2010 Gupta .................... C30B 23/00
117/105
2007/0044707 A1 * 3/2007 Schmid ................ C30B 11/007
117/11
2008/0072817 A1 * 3/2008 Zwieback ............... C30B 23/00
117/84

FOREIGN PATENT DOCUMENTS

| JP | 06-298594 | * 10/1994 |
| JP | H11278985 | 10/1999 |
| JP | 2007076928 | 3/2007 |
| KR | 20050033393 | 4/2005 |

* cited by examiner

PROCESS FOR GROWING SILICON CARBIDE SINGLE CRYSTAL BY PHYSICAL VAPOR TRANSPORT METHOD AND ANNEALING SILICON CARBIDE SINGLE CRYSTAL IN SITU

CROSS-REFERENCE TO RELATED APPLICATIONS

This application is a National Stage application of International Application No. PCT/CN2011/082107, filed on Nov. 11, 2011, which claims priority of Chinese application Serial Number 201010588052.7, filed on Dec. 14, 2010, both of which are incorporated herein by reference in their entireties.

BACKGROUND OF THE INVENTION

1. Field of the Invention

The present invention is mainly applied to crystal growth and post-growth process, specifically, related to a technology for growing silicon carbide single crystals by PVT (Physical Vapor Transport) and a process for in-situ annealing sublimation grown crystal.

2. Description of the Prior Art

The innovation of semiconductor technology plays an increasingly important role with the rapid development in information technologies today. The wide band-gap semiconductor materials, typically, silicon carbide and gallium nitride are the third generation of wide band-gap semiconductor following silicon and gallium arsenide. Compared with the traditional semiconductor material represented by silicon and gallium arsenide, the silicon carbide has a great advantage in properties such as operating temperature, anti-radiation, resistant to breakdown voltage. As the most developed wide band-gap semiconductor materials, silicon carbide exhibits many advantages, such as high thermal conductivity, high critical electric-field breakdown, high saturated electron drift velocity and high bonding energy etc. Its excellent performances can meet the new requirements of modern electronic technology for high-temperature, high-frequency, high-power and anti-radiation, and thus silicon carbide is considered as one of the most promising materials in the field of semiconductor materials. Furthermore, since lattice constant and thermal expansion coefficient of hexagonal silicon carbide are similar to those of gallium nitride, it is an ideal substrate material for manufacturing high-brightness light-emitting diodes (HB-LEDs).

At present, the most effective method for growing silicon carbide crystal is physical vapor transport method (Journal of Crystal Growth 43 (1978) 209-212), the typical growth chamber structure of which is shown in FIG. 1. The inner growth chamber is a graphite crucible, in which the upper part is used to glue seed crystal and the lower part is used to charge silicon carbide raw materials. Insulation is placed close proximity around, above and below the crucible which is typically graphite felt. The quartz sets of water-cooled device are located at the exterior of insulation layers. The flow rate of cooling water is required great due to radiant heat of the insulation layer. An induction coil heater is disposed around the water cooling device. Typically, silicon carbide crystal growth is performed using C plane as a growth face. The shape and the size of heat loss holes in the insulation felt can be controlled, thus silicon carbide raw materials at high temperature sublimate and decompose into vapor substances (mainly consist of Si, $Si_2C$ and $SiC_2$), which are transported to the seed crystal at the lower temperature, and then crystallize to silicon carbide crystals. In this process, it is a key factor to obtain high-quality crystals for a suitable temperature distribution inside growth chamber. Silicon carbide crystal growth process can be generally divided into three stages, an early stage of crystal growth (i.e. seed-on stage); the early-middle crystal growth stage (i.e. diameter enlargement stage) and the mid-to late crystal growth stage (i.e. diameter growth stage). At the initial stage of single crystal growth, the axial temperature gradient inside growth chamber should be controlled relatively small so that the growth interface temperature is relatively high, and further spiral growth centers are made as few as possible, so as to achieve high-quality seed-on growth at the initial stage. At the early-middle crystal growth stage, the axial temperature gradient inside growth chamber should be controlled relatively small while the radial temperature gradient should be controlled relatively large in order to realize diameter enlargement process. At the mid-to late crystal growth stage, the axial temperature gradient inside growth chamber should be controlled relatively large while the radial temperature gradient should be controlled relatively small in order to achieve high-quality single crystal diameter growth process. In conclusion, to obtain high-quality silicon carbide crystals, it is necessary for the temperature distribution inside growth chamber to adjust in real time throughout the entire process of crystal growth. However, the present temperature field distribution inside the growth chamber is achieved mainly through designing the size and the shape of heat loss holes in the insulation materials, which is static and invariable during the growth process, thus the temperature field distribution inside the growth chamber is also static and invariable during the entire crystal growth process.

As the silicon carbide crystal growth process is carried out at a non-equilibrium state, a relative large stress exists in boules of grown crystals, which causes the crystal to rupture during the subsequent fabrication process, thereby directly reducing the crystal yield ratio. Breakage phenomenon during subsequent fabrication is particularly evident for large size crystals (3 inches or more). It is a key and urgent technical problem to optimize in-situ annealing process (annealing immediately in furnace after growth is finished) and secondary annealing process (another annealing process after taking the crystal out of the furnace) so as to remove stress in sublimation grown crystals and thereby improve the finish yield ratio of silicon carbide crystals.

SUMMARY OF THE INVENTION

The invention provides a technology for growing silicon carbide single crystals by PVT (Physical Vapor Transport) and a technology for in-situ annealing the crystals after growth is finished. The process can achieve real-time dynamic control of the temperature distribution of growth chamber by regulating the position of the insulation layer on the upper part of the graphite crucible, thus regulating inner temperature distribution of growth chamber in real-time during the growth process according to the needs of the technology, which helps to significantly improve the crystal quality and production yield ratio. After growth is finished, the inert gas pressure in growth chamber is raised and meanwhile the temperature gradient of the growth chamber is reduced so that in-situ annealing the silicon carbide crystals can be carried out under a small one, which helps to reduce the internal stress between the crystal and the crucible lid as well as that in sublimation grown crystals, thereby reducing the breakage ratio and improving the yield ratio during the subsequent fabrication process.

To accomplish the object, the process for growing silicon carbide single crystals by Physical Vapor Transport comprises:

on loading crucible inside the furnace, regulate the position of the insulation layer by automatic drive and then record a relative position of it inside the furnace body; during the growth process, make use of the automatic drive to adjust the relative position according to the needs of the technology so as to make the temperature distribution of growth chamber form a desired one wherein the structures of the upper thermal insulation layer are fitted with the dimension of heat loss hole located at the upper part of graphite crucible.

Further, materials of thermal insulation layer comprise thermal stable graphite, solid-state graphite felt and/or soft graphite felt.

Further, the structures of the upper thermal insulation layer comprise pillar-shaped, truncated cone shaped and/or cone-shaped insulation layer.

Further, said automatic drive has an automatic lifting function, and running speed, running displacement for each function are continuously adjustable within a certain range. The said running speed is preferably 0.01-50 mm/hour and running displacement is preferably 0-600 mm.

Further, said automatic drive has an automatic stop function, whose lasting time can be continuously adjusted in a certain range. The lasting time is preferably 0-100 hour.

Further, the growth speed of crystals can be 0.1-4 mm/hour.

Further, the dislocation density of crystals is less than $10^3/cm^2$.

However, the present temperature field distribution inside the growth chamber is achieved mainly through designing the size and the shape of heat loss holes in the insulation materials, which is static and invariable during the growth process, thus the temperature field distribution inside the growth chamber is also static and invariable during the entire crystal growth process. However, this condition is not suitable to grow large diameter, high-quality silicon carbide crystals. At the initial stage of single crystal growth, the axial temperature gradient inside growth chamber should be controlled relatively small so that the growth interface temperature is relatively high and further spiral growth centers are made as few as possible. At the early-middle crystal growth stage, the axial temperature gradient inside growth chamber should be controlled relatively small while the radial temperature gradient should be controlled relatively large in order to complete diameter enlargement process. At the mid-to late crystal growth stage, the axial temperature gradient inside growth chamber should be controlled relatively large while the radial temperature gradient should be controlled relatively small.

Real-time regulation of temperature field distribution inside the growth chamber is achieved through an automatic drive to control a relative position of heat insulation layer inside the growth chamber. During the crystal growth process, the automatic drive is used to control the relative position of heat insulation layer in real-time so as to obtain a desired temperature field distribution according to the needs of growth technology. The automatic drive has automatic lifting and stop functions, and running speed, running displacement and lasting time for each function are continuously adjustable within a certain range to meet the requirements of practical growth technology. Because the temperature field distribution of crucible can be regulated according to the requirements of practical process, it can be assured to obtain desired size crystals, thereby decrease the densities of micropipe and dislocation in crystals and improve the speed of crystal growth and quality of crystallization. In the boules of grown single crystals, the dislocation density is less than $10^3/cm^2$, crystal growth speed is continuously adjusted in the range of 0.1-4 mm/hour.

To accomplish the object, the process for in-situ annealing according to the invention comprises the steps of:

1) after silicon carbide single crystal growth is finished, slowly increase an inert gas pressure inside the growth chamber and slowly enhance the heat insulation of the growth chamber to reduce temperature gradient of crucible, and maintain the crucible at the growth temperature;
2) maintain the growth temperature about 10-40 hours;
3) make the crucible temperature slowly decline from the growth temperature to room temperature with a period of about 20-50 hours.

Further, said slowly increasing an inert gas pressure inside the growth chamber to 10,000 Pa or more, preferably 50,000 Pa or more.

Further, said slowly enhancing the heat insulation of the growth chamber to diminish temperature gradient of the crucible comprises slowly making the heat insulation layer drop to growth chamber.

Further, maintaining the crucible at the growth temperature comprises real-time regulation of power of RF coil.

Further, the temperature gradient of the crucible is less than 10° C./cm, preferably less than 5° C./cm.

Further, said inert gas comprises argon or helium.

Further, the size of said silicon carbide crystal is 2-8 inches.

Further, the polytypes of the said silicon carbide crystals are 4H—SiC, 15R—SiC and/or 6H—SiC.

Further, said silicon carbide crystals include conductive type and/or semi-insulating silicon carbide crystal.

As the silicon carbide crystal growth process is performed at a non-equilibrium state, a relative large stress exists in boules of grown crystals, which causes the crystal easy to rupture during subsequent fabrication process, thereby directly reducing the crystal yield ratio. It is necessary to in-situ anneal grown crystals in order to remove the stress in them after growth is finished.

During the crystal growth of silicon carbide crystals, certain temperature gradient and lower inert gas pressure (generally 1,000 Pa-10,000 Pa) are needed in growth chamber so that vapor substances of silicon carbide can be transported from high temperature zone of raw materials to low temperature zone of seed crystal and crystallized into silicon carbide crystal. However, during the in-situ annealing of crystals after growth is finished, it is required that the temperature gradient of the crucible should be as little as possible so as to sufficiently set the stress inside crystals free. Due to the different requirements of temperature gradients of growth and annealing, the temperature gradient of the crucible should be regulated in dynamic state. When in-situ annealing is performed on grown crystal, heat insulation layer should slowly drop to the graphite crucible so as to enhance the heat insulation and diminish the temperature gradient of the crucible. At the same time, inert gas pressure (at least 10,000 Pa or more, preferably 50,000 Pa or more) of the crucible slowly rises to prevent grown crystals further decompose and evaporate. On one hand, slow raising inert gas pressure will lead to the decrease in entire temperature inside crucible; on the other hand, enhancing heat insulation will cause the increase in entire temperature inside crucible. During the entire regulation process, it is necessary to take care of the cooperation on both aspects to keep the temperature inside crucible constant. If necessary, the power of heating power supply should be regulated so as to avoid the introduction of new stress into in-situ annealed crystals.

After raising the inert gas pressure and decreasing the temperature gradient inside crucible, growth temperature is kept for about 10-40 h so as to make stress in grown crystals sufficiently set free. Thereafter, the temperature inside crucible will decline from growth temperature to room temperature and the decline time is about 20-50 h. Slow temperature decline is attempted to avoid the introduction of new stress in grown crystal. This stage can be set as several sections according the requirements of technology.

The above process for in-situ annealing silicon carbide crystals can remove stress in grown crystals to a great extent, thereby decreasing the breakage ratio during the subsequent fabrication process and increasing the finish yield ratio of crystals. In addition, the in-situ annealing process can decrease the stress in grown silicon carbide crystals and improve the finish yield ratio of silicon carbide crystals during the subsequent fabrication process.

DETAILED DESCRIPTION OF THE INVENTION

Figure 1:
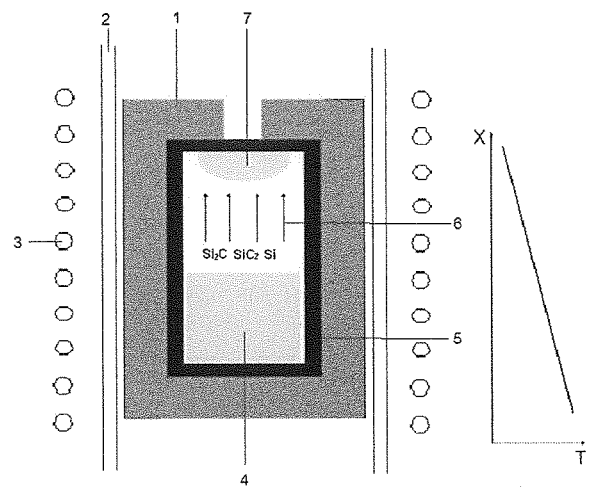
FIG. 1 schematically shows a cross-sectional chamber structure for silicon carbide crystal growth by PVT method.

The methods for growing silicon carbide single crystals by PVT (Physical Vapor Transport) and for in-situ annealing the grown crystals will be described in detail in connection with the following figures. FIG. 1 is a graph schematically showing a crystal growth cross-sectional chamber for silicon carbide crystal growth by induction coil heating, which is popular at present. The inner growth chamber is a graphite crucible 5, which is manufactured by high density, high purity and high intensity graphite. The upper part of the crucible is a growing crystal 7 and the lower part is charged silicon carbide raw materials 4. Thermal insulating materials 1 is placed close proximity around, above and below the crucible which is typically graphite felt. There is a piece of region on the top of graphite crucible 5, where no thermal insulation material 4 exists, which can be used as a heat loss hole. The quartz sets of water-cooled device 2 are located at the exterior of insulation material 4. The flow rate of cooling water is required great due to radiant heat of the insulation material 4. An induction coil heater 3 is disposed around the water cooling device 2 and operative in response to electrical power being applied there to inductively heat the crucible 5, thus silicon carbide raw materials 4 at high temperature sublimate and decompose into vapor substances 6 (mainly consist of Si, $Si_2C$ and $SiC_2$), which are transported to the growing crystal 7 at the lower temperature, and then crystallize to form silicon carbide crystals.

Figure 2:
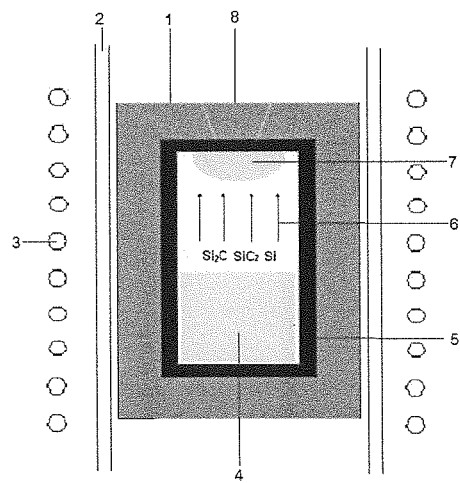
FIG. 2 is schematic representation of arranging thermal insulation layers during the initial crystal growth stage.

FIG. 2 is schematic representation of arranging thermal insulation layer 8 during the initial crystal growth stage, which is the same as FIG. 1 except the addition of truncated cone thermal insulation layer 8. Thermal insulation layer 8 is also manufactured by high temperature resistant graphite materials, the structure of which is fitted with the dimension of heat loss hole located at the upper part of graphite crucible 5. During the initial crystal growth, the thermal insulation layer 8 is located at the inside of heat loss hole so that relatively small temperature gradient and high growth interface temperature can be obtained inside the crucible 5 and thus high quality initial growth process can be realized.

Figure 3:
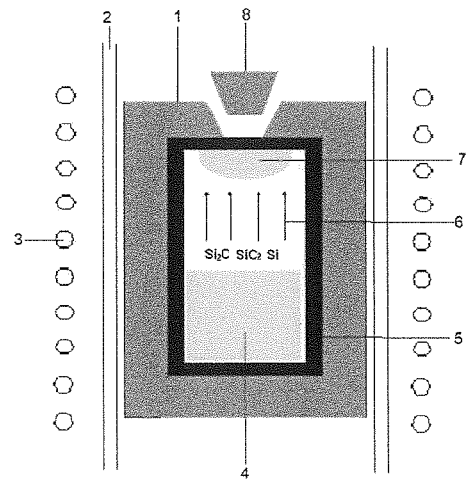
FIG. 3 is schematic representation of raising thermal insulation layers to a preset position during the early-middle crystal growth stage.

FIG. 3 is schematic representation of raising thermal insulation layers 8 during the early-middle crystal growth stage. During this stage, thermal insulation layers 8 slowly rise to a preset position at a certain speed so that relatively small axial temperature gradient and relatively large radial temperature gradient can be obtained inside the crucible 5 and thus diameter enlargement growth process of silicon carbide crystals can be realized.

Figure 4:
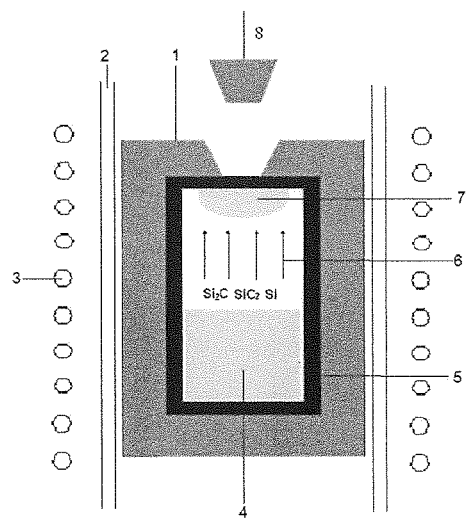
FIG. 4 is schematic representation of keeping thermal insulation layers 8 away from the growth chamber during the mid-to late crystal growth stage.

FIG. 4 is schematic representation of keeping thermal insulation layers 8 away from the graphite crucible 5 during the mid-to late crystal growth stage. During this stage, thermal insulation layers 8 move away from the crucible 5 at a certain speed so that relatively large axial temperature gradient and thus diameter growth process of silicon carbide single crystals can be realized at a relatively quick speed.

Because the distribution of temperature field inside graphite crucible 5 can be adjusted according to the need of actual technology, this growth method can ensure the diameter size of single crystal zone, decrease micropipes and dislocation density in the crystals, and improve the crystal growth speed and crystal quality. The dislocation density of grown crystals by means of the method is less than $10^3/cm^2$ and crystal growth speed can be adjusted continuously within the range of 0.1-4 mm/hour.

Stress can be caused by many factors. Generally, it is regarded that temperature gradient is a major factor. In addition, mis-oriented grains at the edge of single crystals or other defects, mismatch thermal expansion coefficient of between crystals and graphite crucible 5, uneven doping inside the crystals or the like can cause stress in the crystals.

Figure 5:
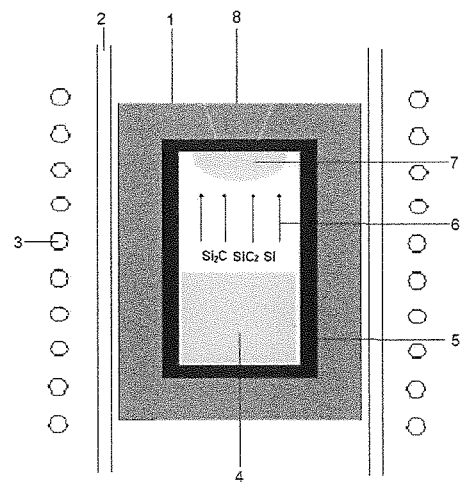
FIG. 5 is schematic representation of the growth chamber on in-situ annealing after growth is finished.
Figure 6:
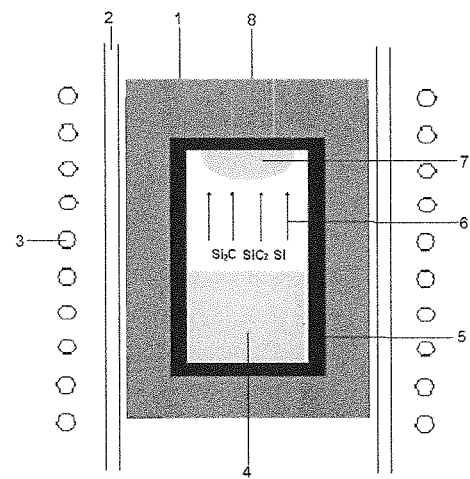
FIG. 6 and FIG. 7 respectively show that the shapes of thermal insulating layer are cylindrical and conic.
Figure 7:
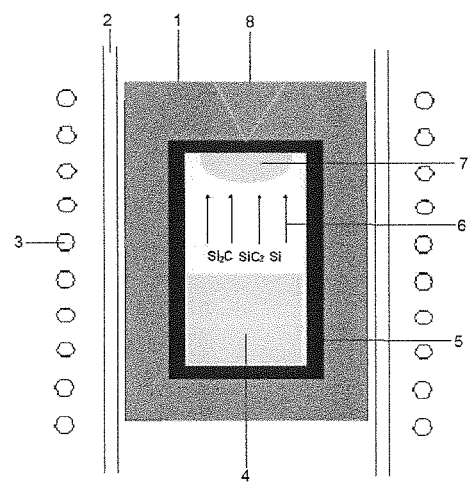

As mentioned in the above background, a certain temperature gradient is needed inside graphite crucible 5 so that silicon carbide vapor substances 6 can be transported from high temperature raw material 4 zone to low temperature growing crystal 7 zone and thus form silicon carbide crystals to achieve the growth of silicon carbide crystals. The temperature gradient will cause stress in the grown crystals during this process. It is necessary for the grown crystals to in-situ anneal in order to remove the stress in grown crystals and decrease the breakage ratio of crystals during the subsequent fabrication process. However, the temperature gradient for crystal growth inside graphite crucible 5 is harmful to stress removal during in-situ annealing. Thermal insulation layer 8 is lowered so as to diminish temperature gradient inside the graphite crucible 5. FIG. 5 is schematic representation of the graphite crucible 5 on in-situ annealing after growth is finished.

The in-situ annealing process may remove stress in grown crystals to a great extent and thus lower the breakage ratio of crystals during the subsequent fabrication process, improve the of finished crystals ratio.

EXAMPLE 1

2 inch 6H semi-insulating silicon carbide crystal is grown by physical vapor transport. After loading graphite crucible 5 inside the furnace, thermal insulating layer 8 with a shape of truncated cone is located at heat loss hole on the top of graphite crucible 5. Inert gas within the growth chamber may be flowing gas with a constant pressure of about 8000 pa. After two-hour crystal growth, the initial crystal growth stage is completed. Then thermal insulation layer 8 moves 10 mm away from graphite crucible 5 at a speed of 0.5 mm/hour with automatic drive, where thermal insulation layer 8 stay for 20 hours to finish the diameter enlargement process at the early-middle crystal growth stage. Subsequently, thermal insulation layer 8 respectively raises 30 mm and 50 mm again at 1 mm/h and 10 mm/h with automatic drive and stay for 80 hours so as to complete the quick diameter growth during the mid-to late crystal growth stage. During the above crystal growth process, the stability of crystal growth interface should be controlled, if necessary, the power of heating power supply may be adjusted. After growth is finished, crystals should be in-situ annealed. The pressure of inert gas inside growth chamber can be slowly increased from 8,000 Pa to 50,000 Pa within 10 hours, meanwhile thermal insulation layer 8 respectively declines 50 mm and 40 mm again at 25 mm/hour and 5 mm/hour. Thermal insulation layer 8 drops into the heat loss hole on the top of graphite crucible 5 again. During the above in-situ annealing process, growth temperature should be kept constant, if necessary, the power of heating power supply may be adjusted. Subsequently, the growth temperature is kept for 10 hours and then temperature inside graphite crucible 5 can drop from the growth temperature to room temperature within 30 hours.

EXAMPLE 2

3 inch 4H conductive silicon carbide crystal is grown by physical vapor transport. After loading graphite crucible 5, thermal insulating layer 8 with a shape of truncated cone is located at heat loss hole on the top of graphite crucible 5. Inert gas within the growth chamber may be flowing gas with a constant pressure of about 5000 pa. After five-hour crystal growth, the initial crystal growth stage is completed. Then thermal insulation layer 8 moves 10 mm away from graphite crucible 5 at a speed of 0.4 mm/hour with automatic drive, where thermal insulation layer 8 stay for 40 hours to finish the diameter enlargement process at the early-middle crystal growth stage. Subsequently, thermal insulation layer 8 respectively raises 30 mm and 50 mm again at 1 mm/hour and 10 mm/hour with automatic drive and stay for 80 hours so as to complete the quick diameter growth during the mid-to late crystal growth stage. During the above crystal growth, the stability of crystal growth interface should be controlled, if necessary, the power of heating power supply may be adjusted. After growth is finished, crystals should be in-situ annealed. The pressure of inert gas inside growth chamber can be slowly increased from 5,000 Pa to 30,000 Pa within 10 hours, meanwhile thermal insulation layer 8 respectively declines 50 mm and 40 mm again at 25 mm/hour and 5 mm/hour. Thermal insulation layer 8 drops into the heat loss hole on the top of graphite crucible 5 again. During the above in-situ annealing of crystals, growth temperature should be kept constant, if necessary, the power of heating power supply may be adjusted. Subsequently, the growth temperature is kept for 20 hours and then temperature inside graphite crucible 5 can drop from the growth temperature to room temperature within 40 hours.

EXAMPLE 3

4 inch 4H conductive silicon carbide crystal is grown by physical vapor transport. When loading graphite crucible 5, thermal insulating layer 8 with a shape of truncated cone is located at heat loss hole on the top of graphite crucible 5. Inert gas within the growth chamber may be flowing gas with a constant pressure of about 3000 pa. After ten-hour crystal growth, the initial crystal growth stage is completed. Then thermal insulation layer 8 moves 10 mm away from graphite crucible 5 at a speed of 0.3 mm/hour with automatic drive, where thermal insulation layer 8 stay for 50 hours to finish the diameter enlargement process at the early-middle crystal growth stage. Subsequently, thermal insulation layer 8 respectively raises 30 mm and 50 mm again at 0.5 mm/hour and 10 mm/hour with automatic drive and stay for 80 hours so as to complete the quick diameter growth stage during the mid-to late crystal growth stage. During the above crystal growth, the stability of crystal growth interface should be controlled, if necessary, the power of heating power supply may be adjusted. After growth is finished, crystals should be in-situ annealed. The pressure of inert gas inside growth chamber can be slowly increased from 3,000 Pa to 30,000 Pa within 8 hours, meanwhile thermal insulation layer 8 respectively declines 50 mm and 40 mm again at 25 mm/hour and 6.7 mm/hour. Thermal insulation layer 8 drops into the heat loss hole on the top of graphite crucible 5 again. During the above in-situ annealing process, growth temperature should be kept constant, if necessary, the power of heating power supply may be adjusted. Subsequently, the growth temperature is kept for 25 hours and then temperature inside graphite crucible 5 can drop from the growth temperature to room temperature within 50 hours.

EXAMPLE 4

6 inch 6H conductive silicon carbide crystal is grown by physical vapor transport. When loading graphite crucible 5, thermal insulating layer 8 with a shape of truncated cone is located at heat loss hole on the top of graphite crucible 5. Inert gas within the growth chamber may be flowing gas with a constant pressure of about 2500 pa. After fifteen-hour crystal growth, the initial crystal growth stage is completed. Then thermal insulation layer 8 moves 10 mm away from graphite crucible 5 at a speed of 0.2 mm/hour with automatic drive, where thermal insulation layer 8 stay for 65 hours to finish the diameter enlargement process at the early-middle crystal growth stage. Subsequently, thermal insulation layer 8 respectively rises 30 mm and 50 mm again at 0.5 mm/h and 10 mm/h with automatic drive and stay for 85 h so as to complete the quick diameter growth process during the mid-to late crystal growth stage. During the above crystal growth, the stability of crystal growth interface should be controlled, if necessary, the power of heating power supply may be adjusted. After growth is finished, crystals should be in-situ annealed. The pressure of inert gas inside graphite crucible 5 can be slowly increased from 2,500 Pa to 30,000 Pa within 6 hours, meanwhile thermal insulation layer 8 respectively declines 50 mm and 40 mm again at 25 mm/hour and 10 mm/hour. Thermal insulation layer 8 drops into the heat loss hole on the top of graphite crucible 5 again. During the above in-situ annealing of crystals, growth temperature should be kept constant, if necessary, the power of heating power supply may be adjusted. Subsequently, the growth temperature is kept for 25 hours and then temperature inside graphite crucible 5 can drop from the growth temperature to room temperature within 35 hours.

It should be pointed out the above mentioned specific embodiments are intended to illustrate the invention in detail, but not limiting to the invention. Various modifications of types and details are possible for the skilled in the prior technology without departing the spirit and scope of attached claims.

What has been described above are preferred aspects of the present invention. It is of course not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, combinations, modifications, and variations that fall within the spirit and scope of the appended claims.

We claim:

1. A process for growing silicon carbide single crystals on a seed crystal by Physical Vapor Transport, for achieving real-time dynamic control of the temperature distribution of a growth chamber by regulating the position of a thermal insulation layer on the upper part of a graphite crucible, for controlling the temperature distribution of the growth chamber in real-time during the growth process according to the needs of the technology, wherein said process comprises the following steps:
   mounting a seed crystal in an upper part of a growth chamber defined with a graphite crucible, wherein the graphite crucible comprises an insulation layer and an upper portion;
   loading the graphite crucible inside the furnace and heating the graphite crucible within the furnace to produce silicon carbide vapor within the growth chamber by selecting a material of the insulation layer in the upper portion of the crucible from the group consisting of solid-state graphite felt, soft graphite felt and a combination of solid-state graphite felt and soft graphite felt, regulating the position of the thermal insulation layer relative to the upper portion of the crucible in the upper portion of the crucible by an automatic drive for providing controlled heat loss from the upper portion of the crucible and for controlling growth of the crystal, and then recording a relative position of the thermal insulation layer inside the furnace body; and
   during the growth process, using the automatic drive to adjust the relative position of the thermal insulation layer according to the needs of the technology to make the temperature distribution of the growth chamber to form a desired temperature distribution, wherein a heat loss hole is located at the upper part of the graphite crucible and wherein the structures of the upper thermal insulation layer are fitted with the dimension of the heat loss hole located at the upper part of said graphite crucible, wherein the insulation layer comprises an opening and a plug for the opening in the upper portion of the graphite crucible, wherein the material of the plug is selected from the same group as the remainder of the insulation layer in the upper portion of the graphite crucible, wherein the step of adjusting a configuration of the insulating layer comprises moving the plug by the automatic drive, and wherein the shape of the plug comprises a shape selected from the group consisting of a pillar-shape, a truncated cone shape, and a cone shape.

2. The process according to claim 1, wherein said automatic drive has an automatic lifting function, and wherein running speed and running displacement of the automatic drive are continuously adjustable within a certain range.

3. The process according to claim 2, wherein said automatic drive has an automatic lifting function, for each function, wherein the running speed and running displacement are continuously adjustable respectively in 0.01-50mm/hour and 0-600mm ranges.

4. The process according to claim 1, wherein said automatic drive has an automatic stop function, wherein the lasting time can be continuously adjusted in a certain range.

5. The process according to claim 4, wherein said automatic drive has an automatic stop function, wherein the lasting time can be continuously adjusted in the range of 1-100 hours.

6. The process according to claim 1, wherein a growth rate of the silicon carbide is adjusted to 0.1mm/h-4mm/h.

7. The process according to claim 1, wherein the growth rate of the silicon carbide crystal is adjusted so that the dislocation density of single crystals is less than $10^3/cm^2$.

8. An in-situ annealing process for in-situ annealing silicon carbide single crystals after growth is finished according to a silicon carbide single crystal growing process for growing silicon carbide single crystals on a seed crystal by Physical Vapor Transport, in order to achieve real-time dynamic control of the temperature distribution of a growth chamber by regulating the position of a thermal insulation layer on the upper part of a graphite crucible, for controlling the temperature distribution of the growth chamber in real-time during the growth process according to the needs of the technology, wherein said process for growing silicon carbide single crystals on a seed crystal by physical vapor transport comprises the following steps:
   mounting a seed crystal in an upper part of a growth chamber defined with a graphite crucible, wherein the graphite crucible comprises an insulation layer and an upper portion;
   loading the graphite crucible inside the furnace and heating the graphite crucible within the furnace to produce silicon carbide vapor within the growth chamber by selecting a material of the insulation layer in the upper portion of the crucible from the group consisting of solid-state graphite felt, soft graphite felt and a combination of solid-state graphite felt and soft graphite felt, regulating the position of the thermal insulation layer relative to the upper portion of the crucible in the upper portion of the crucible by an automatic drive for providing controlled heat loss from the upper portion of the crucible and for controlling growth of the crystal, and then recording a relative position of the thermal insulation layer inside the furnace body; and
   during the growth process, using the automatic drive to adjust the relative position of the thermal insulation layer according to the needs of the technology to make the temperature distribution of the growth chamber to form a desired temperature distribution, wherein a heat loss hole is located at the upper part of the graphite crucible and wherein the structures of the upper thermal insulation layer are fitted with the dimension of the heat loss hole located at the upper part of said graphite crucible, wherein the insulation layer comprises an opening and a plug for the opening in the upper portion of the graphite crucible, wherein the material of the plug is selected from the same group as the remainder of the insulation layer in the upper portion of the graphite crucible, wherein the step of adjusting a configuration of the insulating layer comprises moving the plug by the automatic drive, and wherein the shape of the plug comprises a shape selected from the group consisting of a pillar-shape, a truncated cone shape, and a cone shape, wherein the in-situ annealing process comprises the steps of:
   1) after growth is finished according to the silicon carbide single crystal growing process, increasing an inert gas pressure inside the growth chamber to at least 10,000 Pa, and adjusting the configuration of the upper thermal insulation layer in the upper portion of the crucible using the automatic drive to reduce the temperature gradient to less than 10° C./cm across the insulation layer, to maintain the crucible at the growth temperature;

2) maintaining the crucible at the growth temperature for about 10-40 hours; and 3) making the graphite crucible temperature decline from the growth temperature to room temperature for a period of about 20-50 hours.

9. The process for in-situ annealing according to claim 8, comprising the step of increasing an inert gas pressure inside the growth chamber to at least 50,000 Pa.

10. The process for in-situ annealing according to claim 8, comprising the step of enhancing the heat insulation of the growth chamber to diminish temperature gradient of the crucible which comprises making the thermal insulation layer drop to said growth chamber.

11. The process for in-situ annealing according to claim 8, wherein maintaining the crucible at the growth temperature comprises real-time regulation of the power of a RF coil.

12. The process for in-situ annealing according to claim 8, comprising the step of reducing the temperature gradient of the crucible to less than 5° C./cm.

13. The process for in-situ annealing according to claim 8, wherein said inert gas is selected from the group of gases consisting of argon and helium.

14. The process for in-situ annealing according to claim 8, wherein the size of said silicon carbide crystal is 2-8 inches, which includes the conductive type and/or semi-insulating silicon carbide crystal.

15. The process for in-situ annealing according to claim 8, wherein said silicon carbide crystal comprises a polytype selected from the group consisting of a 4H-SiC polytype, a 15R-SiC polytype, a 6H-SiC polytype and a combination of the foregoing group.

* * * * *